United States Patent [19]

Neidig et al.

[11] Patent Number: 4,488,167
[45] Date of Patent: Dec. 11, 1984

[54] CURRENT CONVERTER ASSEMBLY IN A FLAT HOUSING

[75] Inventors: Arno Neidig, Plankstadt; Hübert Hettmann, Hockenheim; Bernd Leükel, Weinheim; Rolf Rief, Mannheim, all of Fed. Rep. of Germany

[73] Assignee: Brown, Boveri & Cie AG, Mannheim-Kafertal, Fed. Rep. of Germany

[21] Appl. No.: 396,655

[22] Filed: Jul. 9, 1982

[30] Foreign Application Priority Data

Jul. 11, 1981 [DE] Fed. Rep. of Germany ....... 3127456

[51] Int. Cl.³ .................... H01L 21/52; H01L 21/58; H01L 23/32; H01L 25/02
[52] U.S. Cl. ......................................... 357/74; 357/80; 357/76; 357/75; 357/72
[58] Field of Search ..................... 357/72, 76, 74, 80, 357/75

[56] References Cited

U.S. PATENT DOCUMENTS 4,079,410 3/1978 Schierz ................................. 357/72
4,394,530 7/1983 Kaufman ............................. 357/80

FOREIGN PATENT DOCUMENTS 8427 1/1977 Japan ..................................... 357/76

Primary Examiner—Andrew J. James
Assistant Examiner—S. V. Clark
Attorney, Agent, or Firm—Herbert L. Lerner; Laurence A. Greenberg

[57] ABSTRACT

Current converter assembly, including a parallelepipedal housing having an upper surface and an interior being filled with a hardened cast insulating compound, the housing including a flat frame having an open top and bottom, a rectangular edge section extended all around the frame, a rib extended all around the frame toward the interior thereof at substantially the middle of the edge section, and steadying struts disposed on the rib, a ceramic plate having a surface facing the interior of the housing and having outer dimensions corresponding to the length and width of the flat frame, conducting copper foils disposed on the surface of the ceramic plate facing the interior of the housing, semiconductor chips being soldered on the copper foils, connecting straps connecting the semiconductor chips to each other, and connecting elements being extended out of the housing from the ceramic plate in a direction perpendicular to the ceramic plate, the connecting elements being retained by the steadying struts and being freely accessible from the upper surface of the housing.

6 Claims, 8 Drawing Figures

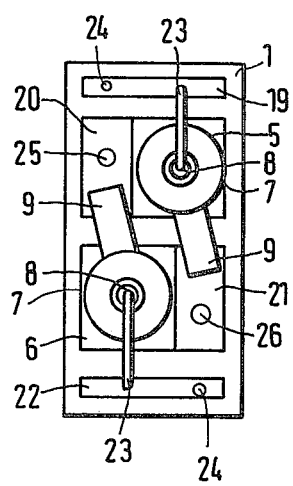
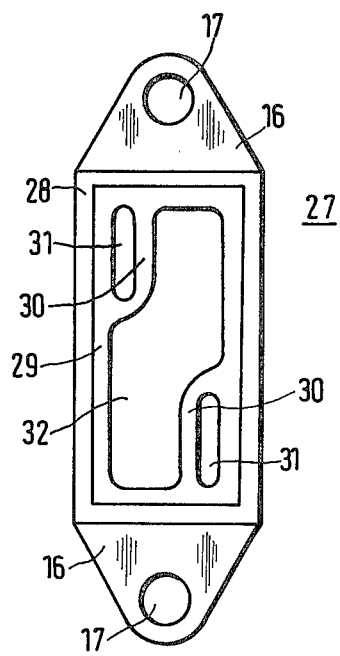
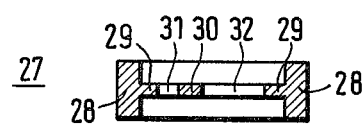
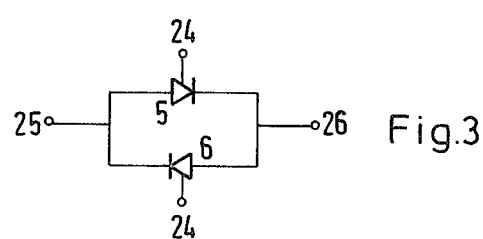

CURRENT CONVERTER ASSEMBLY IN A FLAT HOUSING

The invention relates to a current converter or rectifier assembly with a parallelepipedal housing which is filled with a hardened, cast insulating compound, and a ceramic plate which is provided with conducting copper foils on the surface thereof turned toward the interior of the housing, onto which copper foils semiconductor chips are soldered, the semiconductor chips being connected to each other by connecting straps, and the connecting elements of the current converter being freely accessible from the top of the housing.

Encapsulated current rectifier units, also known as modules, are generally known devices. For branch pair circuits of thyristors and diodes, a housing has already been internationally introduced having a construction and size that is suited for a continuous current range between 20 A and 100 A. However, for currents below 20 amperes, the encapsulation costs are too high, which means that an installation of a lower power circuit must be made into a housing constructed for a higher power circuit. This results in unnecessarily high material and assembly expenditures during manufacture, and it means that the user must provide an unreasonably large space for the assembly.

As an alternative, in a specification sheet of the firm Semicron Gesellschaft fuer Gleichrichterbau und Elektronik m.b.H., Nuernberg, Germany, entitled "Glas-passivierter Thyristor-Tabletten Semipack", (Glass Passivated Thyristor-Pellet Semipack) a current converter assembly with a relatively small housing is proposed as follows: Semipack O, SKKT 15, SKKH 15, SKKD 15, SKKE 15. Even this relatively small housing still disadvantageously requires quite a lot of space. It has a massive ground plate made of nickel plated copper. Though this avoids a bending of the ground plate after the soldering and encapsulation processes, the method for attaching the ground plate is still relatively complicated.

Another manufacturer (MEDL/AEI) already markets a still smaller module for two pair circuits having even less power: Series PB. . . . . In this construction, the insulated ceramic plate is also soldered to a metallic ground plate.

Starting from this state of the art, it is accordingly an object of the invention to provide a current converter assembly, which overcomes the hereinafore-mentioned disadvantages of the heretoforeknown devices of this general type, and which provides such an assembly for two pair circuits with a current strength less than 25 A, having dimensions, especially the height of the housing, which are as small as possible, and which is particularly well suited to be directly mounted onto circuit boards, such as printed circuit boards.

With the foregoing and other objects in view there is provided, in accordance with the invention, a current converter assembly, comprising a parallelepipedal housing having an upper surface and an interior being filled with a hardened cast insulating compound, the housing including a flat frame having an open top and bottom, a rectangular edge section or cross section extended all around the frame, a narrow inner rib extended all around the frame toward the interior thereof at substantially the middle of the edge section, and steadying struts disposed on the rib, a ceramic plate having a surface facing the interior of the housing and having outer dimensions corresponding exactly to the length and width of the flat frame, conducting copper foils disposed on the surface of the ceramic plate facing the interior of the housing, semiconductor chips being soldered on the copper foils, connecting straps connecting the semiconductor chips to each other, and connecting elements of the current converter assembly being in the form of wires or flat connectors extended out of the housing from the ceramic plate in a direction perpendicular to the ceramic plate, the connecting elements being retained by the steadying struts and being freely accessible from the upper surface of the housing.

In accordance with another feature of the invention, the frame has narrow sides having mounting lugs formed thereon, and the mounting lugs have holes formed therein such as for riveting a metal plate under the ceramic plate.

In accordance with a further feature of the invention, the copper foils include a separate foil soldered to each of the semiconductor chips and at least one additional foil, each of the connecting straps being soldered from a semiconductor chip on one of the foils to another of the foils, and the connecting elements include a separate element being soldered to each of the foils.

In accordance with an added feature of the invention, the steadying struts and rib are narrower than the rectangular edge section.

In accordance with a concomitant feature of the invention, the frame has an opening formed therein being bordered by the steadying struts and rib for accomodating the semiconductor chips.

The advantages resulting from the invention lie especially in the fact that the current converter assembly exhibits a low heat resistance between its active part and the outer surface of the housing, due to the inserted ceramic plate. The coplexity of the assembly and encapsulation is advantageously kept at a minimum. The user need only provide very small mounting surfaces which permits the production of a compact package. In contrast to the known current converter devices, the carrying function of the module is effected by the ceramic plate itself, instead by the housing.

Other features which are considered as characteristic for the invention are set forth in the appended claims.

Although the invention is illustrated and described herein as embodied in a current converter assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in the connection with the accompanying drawings, in which:

FIG. 1 is a diagrammatic top plan view of a regulating circuit including two anti-parallel connected thyristors;

FIG. 2 is a top plan view of a frame for the circuit of FIG. 1, which is made of plastic;

FIG. 3 is an electric schematic circuit diagram of the regulating circuit;

FIG. 7 is a diagrammatic cross-sectional view taken through the frame of FIG. 2.

Figure 5:
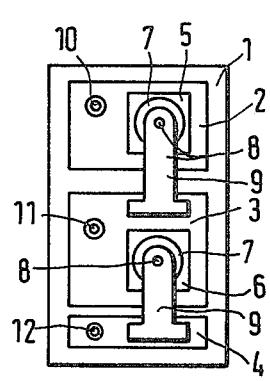
FIG. 5 is a view similar to FIG. 1 of a thyristor branch pair.

Referring now to the figures of the drawing, and first particularly to FIG. 1 thereof, there is seen a regulating circuit including two anti-parallel connected thyristors. Copper foils 19, 20, 21 and 22 serving as the conducting pathways are applied to a rectangular ceramic plate 1, according to a method known from pending U.S. patent application Ser. No. 561,124, filed Dec. 12, 1983, which is a continuation of Ser. No. 286,453, filed July 24, 1981. One of two semiconductor chips 5, 6, respectively, (such as thyristors) is soldered with its anode side onto each copper foil 20, 21, respectively. A ring-shaped cathode contact 7 and a gate contact 8, which forms the central gate, lie on the side of each semiconductor chip 5, 6 which is opposite the anode side.

The cathode contact 7 of the semiconductor chip 5 is connected to the copper foil 21 through a connecting strap 9, and is thereby connected with the anode of the semiconductor chip 6. The connecting strap 9 is therefore soldered at one side thereof to the ring-shaped cathode contact 7, and at the other side thereof it is soldered to the copper foil 21. In the same manner, the cathode contact 7 of the semiconductor chip 6 is connected to the copper foil 20 through a connecting strap 9. Anode-cathode connecting wires 25 and 26 are soldered to the copper foils 20 and 21, respectively. The connecting wires 25 and 26 are each provided with an expanded base portion to increase the strength of the solder joint.

The central gate contact 8 of the semiconductor chip 5 is connected to the copper foil 19 by a gate connecting strap 23; both ends of the strap 23 being soldered. Furthermore, a connecting wire 24 for the external gate connection is soldered to the copper foil 19.

In FIG. 2 there is seen a frame 27 made of synthetic material, which receives the assembled ceramic plate 1 constructed according to FIG. 1. The frame 27 has a wide rectangular edge cross section 28 all around, including a narrow rib 29 at the interior of the frame which runs all around the frame, so that the edge-rib assembly has a T-shaped cross section, best seen in FIG. 7. Two steadying struts 30 are formed on the inner rib 29, so that two elongated openings 31 are formed between the inner rib 29 and the struts 30. These openings serve for passing through the connecting wires 24, 25, 26. Th3 open interior of the housing which is bordered by the frame is designated by reference numeral 32.

The frame 27 can be provided at its two narrow sides with molded mounting lugs 16. Holes 17 are formed in the lugs 6 for fastening a cooling body or heatsink, or a metallic ground plate, either by rivets or by screws.

In FIG. 7, a cross section through the frame 27 is shown. FIG. 7 illustrates the rectangular cross section of the edge 28 and the molded inner rib 29 which runs around the interior. Between the steadying strut 30 and the rib 29 is the opening 31 for the feed through of the wires 24 and 25 at one side, and at the other side there is seen the open housing interior 32.

Figure 4:
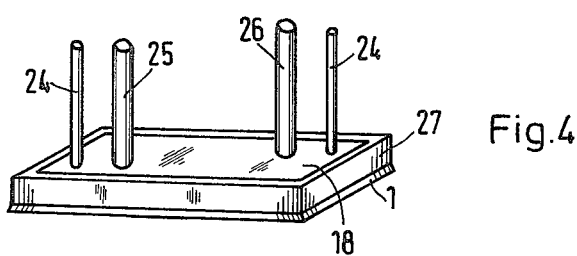
FIG. 4 is a diagrammatic perspective view of the encapsulated current rectifier module.

After the plastic frame 27 is cemented to the assembled ceramic plate, the housing which has thus been created is filled or encapsulated with potting compound or casting resin 18, and the finished current converter or inverter module is produced, as shown in FIG. 4. The required space and especially the height of the module are advantageously low. The connecting wires 24 and 25 which come out on top of the module, facilitate its solder connection to a printed circuit board.

Figure 6:
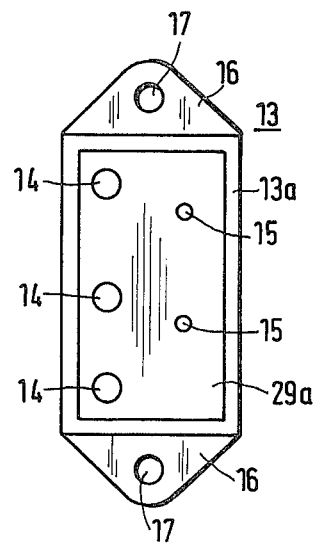
FIG. 6 is a view similar to FIG. 2 of a plastic frame for the thyristor branch pair of FIG. 5.

If so desired, the module shown in FIG. 4 can also be provided with the mounting lugs of FIG. 2 or FIG. 6 for fastening it to a heat sink or a metallic ground plate; however, if the module is only mounted to a printed circuit board, these lugs 16 are not required because in this case the rectifier device is only mounted by soldering its connecting wires.

In FIG. 3, the electrical schematic circuit diagram for the rectifier or converter assembly according to FIGS. 1 and 2 is shown. In FIG. 3 the gate connecting wires are designated with reference numeral 24, and the anode-cathode connecting wires with reference numerals 25 and 26. The anti-parallel disposed thyristors are designated by reference numerals 5 and 6.

In FIG. 5, another embodiment is shown in the form of a thyristor branch pair. Three copper foils 2, 3 and 4 are provided on the ceramic plate 1, and serve as the conducting pathways. The semiconductor chip 5 is soldered with its anode side to the copper foil 2.

The ring-shaped cathode contact 7 of the semiconductor chip 5 is connected to the copper foil 3 through the connecting strap 9, so that both ends of the strap 9 are soldered. The semiconductor chip 6 is soldered with its anode to the copper foil 3, and is thereby connected to the cathode of the semiconductor chip 5. The ring-shaped cathode contact 7 of the chip 6 is soldered to the copper foil 4 through a connecting strap 9.

External connecting wires 10, 11 and 12 are soldered to the copper foils 2, 3 and 4, respectively.

A header wire is soldered onto each gate contact 8, serving as the external control connection or terminal. The ceramic plate 1 assembled as described above is placed onto a plastic frame 13 according to FIG. 5, which is cemented to the plate 1. The frame 13 is surrounded by an edge 13a which has a rectangular cross section, and corresponds in its length and width exactly to the dimensions of the ceramic plate. The rib 29 and the steadying strut 30 of FIG. 2 are constructed in this embodiment as a uniform plate 29a, which is provided with three holes 14 for the passage of the main connecting wires 10, 11, 12, and with two holes 15 for the passage of the control connection wires from the gate contact 8. The regions of the plate 29a near the holes 14, 15 may be considered to be the steadying struts, while the other regions represent the rib.

The current rectifier or converter apparatus can by choice be made either with an open ceramic plate 1 as the cooling surface, or it can also be produced with a metallic ground plate. Again, mounting lugs 16 can be provided at the narrow sides of the frame 13 for fastening the metallic ground plate. These mounting lugs 16 each have a hole 17 formed therein. With the aid of these lugs 16, it is possible, for example, to rivet an aluminum plate under the ceramic plate 1.

Figure 8:
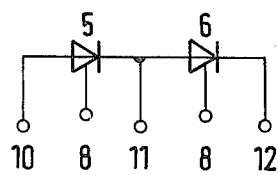
FIG. 8 is an electric schematic circuit diagram of the branch pair.

In FIG. 8, the electrical schematic circuit diagram is shown for the thyristor branch pair according to FIGS. 5 and 6. FIG. 8 shows the anti-parallel connection of the semiconductor chips 5, 6 (such as thyristors) with the anode-cathode terminals 10, 11 and 12 as common connection points, and it also shows the gate terminals 8.

As an alternative, the rectifier or converter apparatus according to FIG. 5 can also be constructed with two diodes, or each with one diode and one thyristor (thyristor-diode branch pair).

We claim:

1. Current converter assembly, comprising a parallelepipedal housing having an upper surface and an interior being filled with a hardened cast insulating compound; said housing including: a flat frame having an open top and bottom, a rectangular edge section extended all around said frame, a rib extended all around said frame toward the interior thereof at substantially the middle of said edge section, and steadying struts disposed on said rib; and a ceramic plate having a surface facing the interior of said housing and having outer dimensions corresponding to the length and width of said flat frame, conducting copper foils disposed on said surface of said ceramic plate facing the interior of said housing; semiconductor chips being soldered on said copper foils; connecting straps connecting said semiconductor chips to each other; and connecting elements being extended out of said housing from said ceramic plate in a direction perpendicular to said ceramic plate, said connecting elements being retained by said steadying struts and being freely accessible from the upper surface of said housing.

2. Current converter assembly according to claim 1, wherein said frame has narrow sides having mounting lugs formed thereon, and said mounting lugs have holes formed therein.

3. Current converter assembly according to claim 1, wherein said frame has narrow sides having mounting lugs formed thereon, and said mounting lugs have holes formed therein for riveting a metal plate under said ceramic plate.

4. Current converter assembly according to claim 1, wherein said copper foils include a separate foil soldered to each of said semiconductor chips and at least one additional foil, each of said connecting straps being soldered from a semiconductor chip on one of said foils to another of said foils, and said connecting elements include a separate element being soldered to each of said foils.

5. Current converter assembly according to claim 1, wherein said steadying struts and rib are narrower than said rectangular edge section.

6. Current converter assembly according to claim 5, wherein said frame has an opening formed therein being bordered by said steadying struts and rib for accomodating said semiconductor chips.

* * * * *